United States Patent
Behfar et al.

(10) Patent No.: US 7,245,645 B2
(45) Date of Patent: Jul. 17, 2007

(54) SURFACE EMITTING AND RECEIVING PHOTONIC DEVICE WITH LENS

(75) Inventors: Alex A. Behfar, Ithaca, NY (US); Alfred T. Schremer, Freeville, NY (US); Cristian B. Stagarescu, Ithaca, NY (US)

(73) Assignee: BinOptics Corporation, Ithaca, NY (US)

( * ) Notice: Subject to any disclaimer, the term of this patent is extended or adjusted under 35 U.S.C. 154(b) by 300 days.

(21) Appl. No.: 10/963,739

(22) Filed: Oct. 14, 2004

(65) Prior Publication Data

US 2005/0123016 A1      Jun. 9, 2005

Related U.S. Application Data

(60) Provisional application No. 60/578,289, filed on Jun. 10, 2004, provisional application No. 60/512,189, filed on Oct. 20, 2003.

(51) Int. Cl.
*H01S 5/00* (2006.01)

(52) U.S. Cl. .................................. 372/50.1; 372/50.23

(58) Field of Classification Search ............... 372/50.1, 372/50.23
See application file for complete search history.

(56) References Cited

U.S. PATENT DOCUMENTS

| 4,851,368 | A   |   | 7/1989 | Behfar-Rad et al. |
|-----------|-----|---|--------|-------------------|
| 5,031,190 | A   |   | 7/1991 | Behfar-Rad |
| 5,132,983 | A   |   | 7/1992 | Behfar-Rad |
| 5,282,080 | A   | * | 1/1994 | Scifres et al. ............... 359/344 |
| 6,680,961 | B2  |   | 1/2004 | Behfar |
| 6,790,689 | B2  |   | 9/2004 | Behfar |
| 6,839,365 | B1  | * | 1/2005 | Sonoda et al. ................ 372/22 |

OTHER PUBLICATIONS

B. Stegmuller et al. "Surface Emitting InGaAsP/InP Distributed Feedback Laser Diode at 1.53 um with Monolitic Integrated Microlens" IEEE Photonics Technology Letters, vol. 3, No. 9 Sep. 1991.

* cited by examiner

*Primary Examiner*—Michael Dung Nguyen
(74) *Attorney, Agent, or Firm*—Jones, Tullar & Cooper, PC

(57) ABSTRACT

A surface-emitting laser, in which light is emitted vertically at one end from a near 45°-angled facet, includes a second end having a perpendicular facet from which light is emitted horizontally, for monitoring. The surface-emitting laser comprises a divergence-compensating lens on the surface above the near 45°-angled facet.

26 Claims, 13 Drawing Sheets

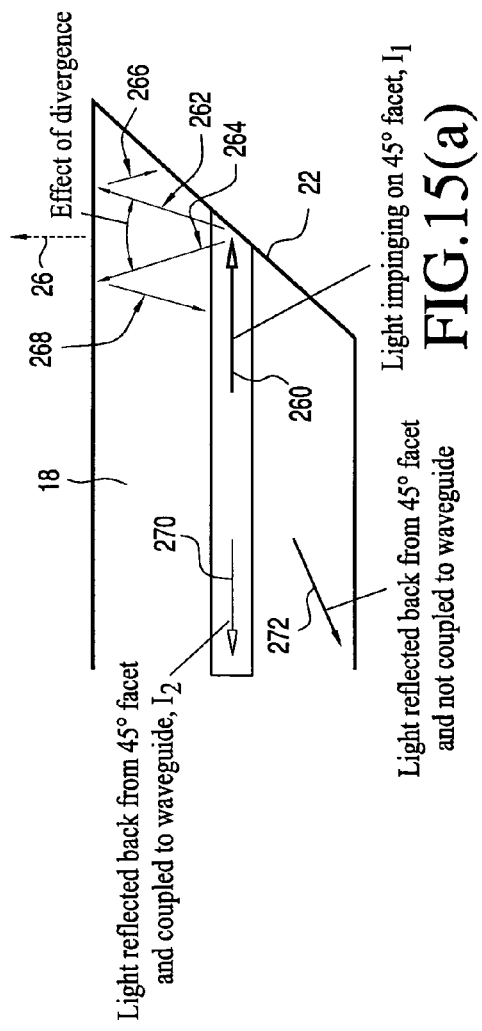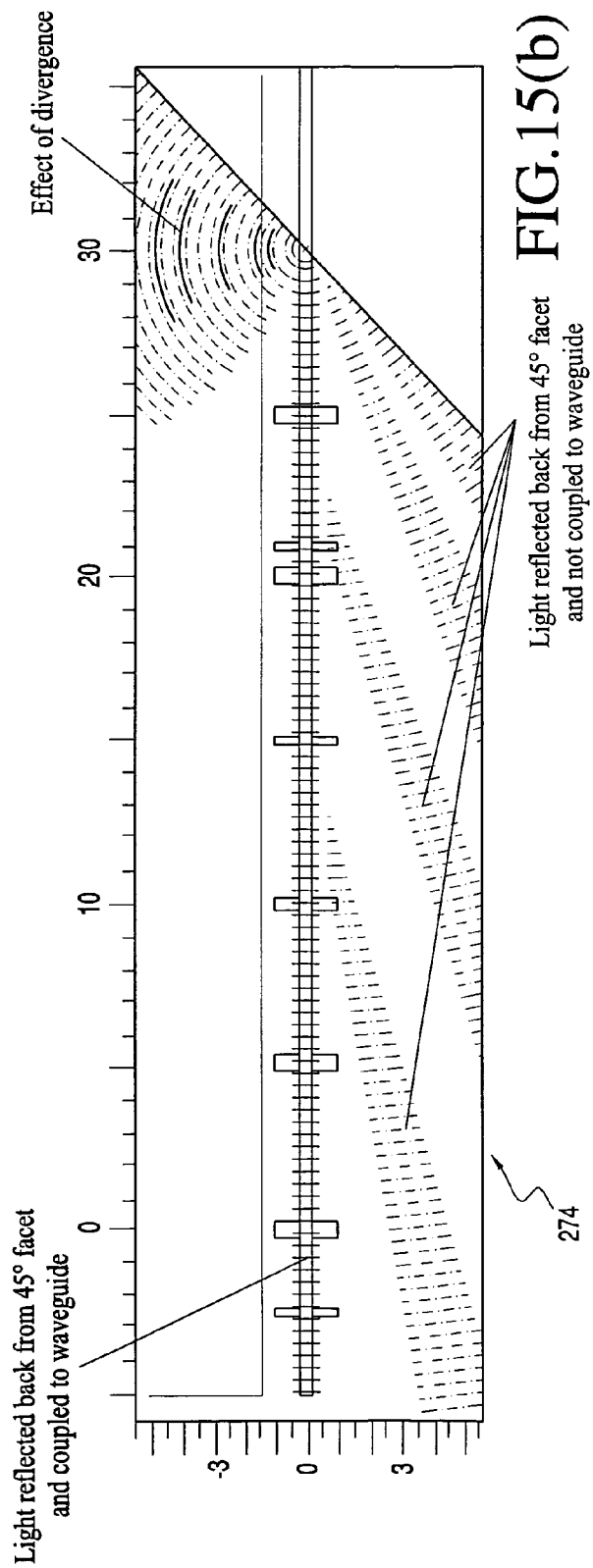

SURFACE EMITTING AND RECEIVING PHOTONIC DEVICE WITH LENS

BACKGROUND OF THE INVENTION

This application claims the benefit of U.S. Provisional Application No. 60/512,189, filed Oct. 20, 2003, and of U.S. Provisional Application No. 60/578,289, filed Jun. 10, 2004, the disclosures of which are hereby incorporated herein by reference.

The present invention relates, in general to improved surface emitting and receiving photonic devices and methods for fabricating them, and more particularly to surface emitting photonic devices incorporating a lens for improved efficiency.

Semiconductor lasers typically are fabricated by growing the appropriate layered semiconductor material on a substrate through Metalorganic Chemical Vapor Deposition (MOCVD) or Molecular Beam Epitaxy (MBE) to form an active layer parallel to the substrate surface. The material is then processed with a variety of semiconductor processing tools to produce a laser optical cavity incorporating the active layer, and metallic contacts are attached to the semiconductor material. Finally, laser mirror facets typically are formed at the ends of the laser cavity by cleaving the semiconductor material to define edges or ends of the laser optical cavity so that when a bias voltage is applied across the contacts the resulting current flow through the active layer causes photons to be emitted out of the faceted edges of the active layer in a direction perpendicular to the current flow.

The prior art also discloses processes for forming the mirror facets of semiconductor lasers through etching, allowing lasers to be monolithically integrated with other photonic devices on the same substrate. The formation of total-internal-reflection facets within an optical cavity through the creation of such facets at angles greater than the critical angle for light propagating within the cavity is also known.

The use of an etch process to form two total-internal-reflection facets at each end of a linear laser cavity, with each facet being positioned at an angle of 45° with respect to the plane of the active layer, is also described in the prior art. In such devices, light in the cavity may be directed perpendicularly upward at one end of the cavity, resulting in surface emission at one facet, while the facet at the other end of the cavity may be oppositely angled to direct the light perpendicularly downward to, for example, a high reflectivity stack below the laser structure.

The prior art also describes devices that combine etched 45° facets with cleaved facets. The resultant devices cannot be tested in full-wafer and as such suffer from the same deficiencies as cleaved facet devices. Furthermore, they are incompatible with monolithic integration in view of the need for cleaving. Chao, et al., IEEE Photonics Technology Letters, volume 7, pages 836-838, attempted to overcome these short-comings, however, by providing an interrupted waveguide structure, but the resultant device suffered from scatter at each end of the laser cavity. The prior art also describes the use of collimating InP lenses; however, these were etched below 45° facets after the substrate was thinned to 50 μm and the lenses were formed on the substrate side.

Vertical Cavity Surface Emitting Lasers (VCSELs) have gained popularity over the past several years; however, VCSELs do not allow in-plane monolithic integration of multiple devices and only allow light to exit their surface mirror at perpendicular incidence. A common aspect of these prior surface-emitting devices is that the photons are always emitted from the optical cavity in a direction perpendicular to the plane of the active layers.

SUMMARY OF THE INVENTION

In accordance with the present invention, improved surface emitting semiconductor lasers are provided in which light is emitted at an emitter end of an optical cavity in a direction vertical to the plane of the laser active layer, and in which light is emitted at a reflective region at the opposite end of the cavity in the plane of the active layer. This arrangement facilitates monitoring of laser operation without adversely affecting the light output. In accordance with one form of the invention, a reflection modification layer or stack is provided on the emitter end while in another form of the invention filter elements are provided within the laser cavity, to permit operation of the laser in an essentially single longitudinal mode. Furthermore, in accordance with the invention, surface and in-plane detectors are provided on the same substrate as the laser, and multiple laser cavities are positioned to enable the emission of multiple wavelengths at a common location.

One embodiment of the invention is directed to an improved surface emitting laser, wherein a semiconductor laser in the form of an elongated cavity on a substrate is fabricated with a succession of layers, including active layers parallel to the substrate surface, upper and lower cladding layers, and upper contact layers, with an angled facet at a first emitter end, and with a reflective region including a perpendicular facet at a second reflective end. The laser may be in the form of a ridge waveguide which tapers outwardly at the emitter end, while the reflective region at the second end of the laser may, in one form of the invention, also include a distributed Bragg reflector (DBR) adjacent the facet. The laser device may also include a monitoring photo detector (MPD) adjacent the DBR that responds to the small amount of light that is emitted from the facet in the reflective region to monitor the intensity of the laser. The backside of the MPD preferably is designed to have a near Brewster angle so that it is essentially non-reflective to light propagating in the optical cavity and in the MPD device. The MPD may be formed as an integral part of the DBR so as to contribute to the laser reflectivity at the second end, or may be formed as a separate element. The DBR can be replaced with a reflectivity modification layer or stack.

The upper contact layer, which may be a low bandgap semiconductor material to allow ohmic contacts to be formed, preferably incorporates an aperture in the region of the angled facet to remove light-absorbing layers from the surface and to improve the efficiency of the device.

In another embodiment of the invention, the portion of the top surface of the optical cavity at the emitter end, which extends over the angled facet and includes the aperture described above, which surface is parallel to the active layers, may be coated with a dielectric layer or stack to modify the reflectivity at the laser output.

The laser device may also incorporate multiple filters at the reflective region to produce still another embodiment in which the device may operate with an essentially single longitudinal mode. Such filters may be formed by etching through the semiconductor layers to form spaced filter elements in series between the end facet of the laser and the distributed Bragg reflector provided in the first embodiment.

Alternatively, the longitudinal mode may be produced by a reflection modification layer or stack on the end facet of the laser in the reflective region.

In accordance with another embodiment of the invention, an optical detector is located on the substrate beside the laser and is integrally formed with the laser in that it uses the same epitaxial structure on the substrate as is used for the laser. In this case, the epitaxial layers are etched during the etching of the laser cavity to fabricate a detector region that occupies a surface of the substrate adjacent to the laser. Suitable electrodes are deposited on the detector region so that light that impinges on it will be detected. This allows both a light emitter and a light detector to be integrally formed on a single substrate side-by-side.

In still another embodiment of the invention the light detector is an integral in-plane detector with a 45° angled facet which is located beside the laser and is fabricated from the same epitaxial structure as is used for the laser. The detector is elongated, and may be generally parallel to the laser axis to conserve space on the substrate. The light to be detected impinges on the detector surface above the angled facet, and is directed into the active region of the detector through the total internal reflection of the angled facet. This surface-receiving detector can be made to be extremely fast by controlling its length and width. The surface above the 45°-angled facet that is parallel to the active layers may be coated with a dielectric layer or stack to make it antireflective for even better operation of the detector.

In order to provide a selectable wavelength output, in accordance with another embodiment of the invention, multiple surface emission laser cavities may be positioned so that their emitting ends are clustered adjacent to each other, with the cavities extending outwardly; for example, as spokes surrounding a central hub. The epitaxial structure in each laser device may be slightly different to cause a different wavelength to be emitted from each one. The proximity of the emitting ends then allows the outputs from all of the lasers to be easily combined into one receiving medium, such as a fiber, and by selectively activating the lasers, a selected wavelength, or wavelengths, can be transferred into the fiber.

In still another embodiment, lasers in accordance with the present invention may be positioned at any desired angle on a substrate to maximize their packing density, since chemically assisted ion beam etching (CAIBE) is used to form the devices, and this process etches uniformly without dependence on the crystallographic planes of the semiconductor material. Thus, for example, they can be placed diagonally on a rectangular substrate. Conventional cleaving does not permit such an orientation.

In still another embodiment of the invention, instead of forming the reflective end of the laser with a vertical facet, it may be desirable to etch it at an angle to produce vertical emission or reception at both ends. The surface above this second angled facet may also have an aperture in the contact layer to prevent absorption, and may incorporate a reflection modification layer or stack.

A problem common to the various embodiments described above is that of divergence of the propagating light in the laser, produced at the angled facet. The light generated in the laser cavity travels axially along the cavity and is reflected upwardly by the angled facet to produce an emitted beam that is perpendicular to the cavity axis. The reflected light experiences diffraction at the totally internally reflective facet and diverges as it travels upwardly through the upper cladding layer of the laser. The light strikes the upper partially reflective top surface of the laser, some light is emitted, and the remaining light is reflected back toward the angled facet. The returned light further diverges, so that only a portion of that light is coupled back into the optical cavity, or waveguide, of the laser in a guided mode. This reduces the efficiency of the laser.

In a preferred form of the invention, the surface emitting or receiving photonic device incorporates a lens formed or deposited on the surface above the angled facet to overcome the foregoing effects of light divergence in the cavity. This lens may be a dielectric material, for example, deposited on the aperture and shaped to compensate for such divergence.

In various embodiments of the invention, the angled facet for the surface emitting or receiving photonic device is a total internal reflection facet at an angle of about 45° so as to produce a perpendicular emission beam or to receive light impinging substantially perpendicularly on the top surface of the device.

BRIEF DESCRIPTION OF DRAWINGS

The foregoing, and additional objects, features and advantages of the present invention will be apparent to those of skill in the art from the following detailed description of preferred embodiments thereof, taken with the accompanying drawings, in which:

FIG. 7 is a top perspective view of a fifth embodiment of a surface-emitting laser in accordance with the invention;

FIGS. 15(a) and 15(b) are cross-sectional views of a surface emitting or receiving photonic device demonstrating mode mismatch due to divergence;

DETAILED DESCRIPTION OF PREFERRED EMBODIMENTS

Figure 1:
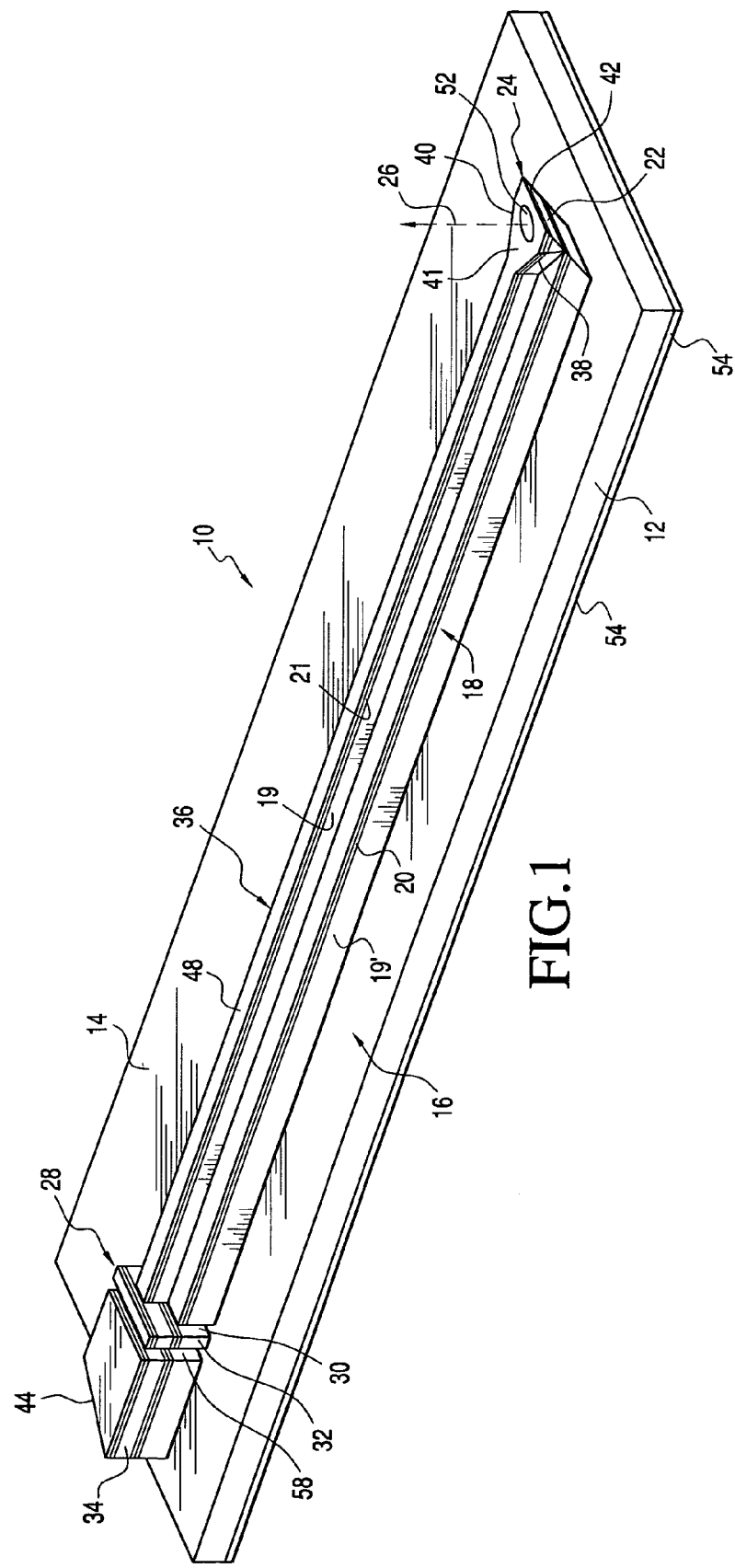
FIG. 1 is a top perspective view of a first embodiment of a surface-emitting laser in accordance with the invention.
Figure 2:
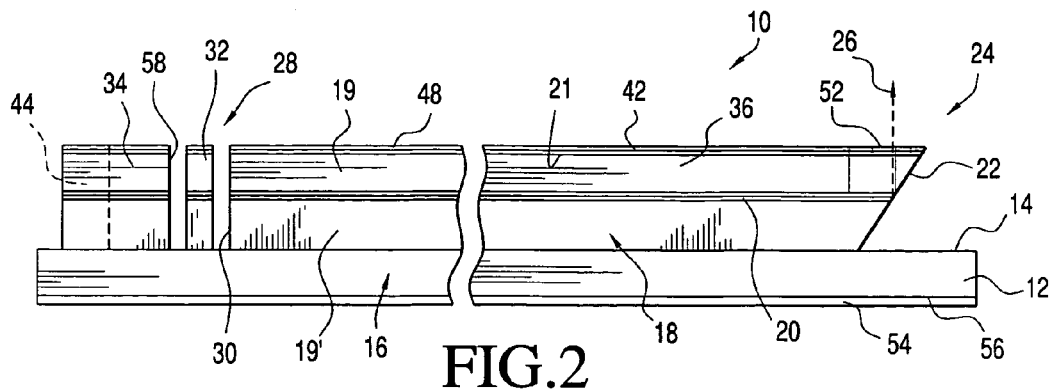
FIG. 2 is a side elevation of the laser of FIG. 1.
Figure 3:
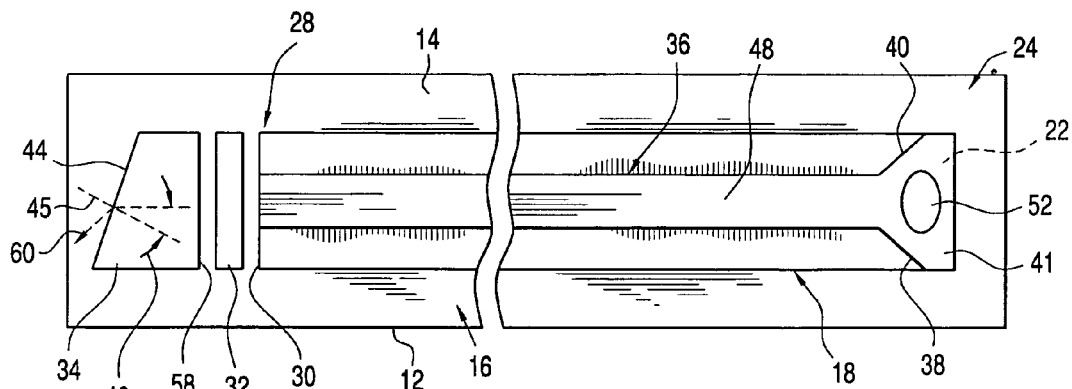
FIG. 3 is a top plan view of the laser of FIG. 1.

Turning now to a more detailed description of the invention, a surface emitting semiconductor laser 10 fabricated on a substrate 12 is illustrated diagrammatically in FIGS. 1-3. Although the invention will be described in terms of a ridge laser, it will be understood that other types of lasers may be fabricated utilizing the features of the invention as herein described.

As is conventional in the fabrication of solid state ridge lasers, the substrate 12 may be formed, for example, of a type III-V compound, or an alloy thereof, which may be suitably doped. The substrate includes a top surface 14 on which is deposited, as by an epitaxial deposition such as Metalorganic Chemical Vapor Deposition (MOCVD) or Molecular Beam Epitaxy (MBE), a succession of layers generally indicated at 16 which form an optical cavity 18 that includes an active region 20. A horizontal cavity semiconductor laser structure such as the optical cavity 18 typically contains upper and lower cladding regions 19 and 19', that are formed from a semiconductor material such as InP which has a lower index than that of the adjacent active region 20. This region 20 may be formed with InAlGaAs-based quantum wells and barriers. A transition layer 21 of InGaAsP is formed on the top surface of cladding region 19.

An angled facet 22 is formed at a first, or emitter end 24 of the cavity 18 by a masking and etching process in which the facet is etched downwardly and inwardly, preferably at or near a 45° angle with respect to the surface 14. This facet is angled to cause light generated in the optical cavity to be emitted in a direction that is essentially perpendicular, or close to perpendicular, to the plane of the active region 20 and to the surface 14. The emitter end facet 22 is substantially totally internally reflective so that light propagating along the longitudinal axis of the optical cavity 18 is reflected in a direction perpendicular to this axis, and thus travels vertically upwardly in the direction of arrow 26, as viewed in the Figures.

At a second, or reflective end of the optical cavity, generally indicated at 28, an end facet 30 is formed at an angle of 90° with respect to the longitudinal axis of the cavity, and thus substantially perpendicular to the active region 20 of the laser. In addition, a distributed Bragg reflector (DBR) element 32 and a monitoring photo detector (MPD) 34 are formed at end 28, facet 30 and elements 32 and 34 being formed through masking and etching in known manner. A ridge 36, extending between emitter end 24 and reflective end 28, is formed by masking and etching the optical cavity 18 above the active region 20 to form the ridge-type laser 10. At the emitter end 24, the ridge 36 is widened, or tapered outwardly, as at edges 38 and 40, to provide an open area 41 above the facet 22 to allow the beam 26 to emerge through the top surface 42 of the optical cavity 18 without distortion.

The back of the MPD portion 34 which is the left-hand end as viewed in FIGS. 1-3, is etched to form an exit facet 44. A line 45 perpendicular to the surface of facet 44 forms an angle 46 with respect to the longitudinal axis of the optical cavity 18 (FIG. 3) at or near the Brewster angle for the material from which the laser 10 is fabricated, so that facet 44 has zero or near-zero reflectivity for light generated in cavity 18. Some of the laser light generated in the optical cavity 18 and propagating longitudinally is emitted at facet 30, passes through the Bragg reflector 32, and is received by MPD 34 which monitors the operation of the laser. A portion of this light reaches facet 44, but is dissipated at that facet because of its zero or near-zero reflectivity, and this prevents undesirable back reflection to the laser.

A top electrical contact layer 48 on the top surface 42 of the ridge 36 is typically a low bandgap semiconductor, such as InGaAs, that allows ohmic contacts to be formed with a metal layer applied to it. The transition layer 21 typically is a semiconductor having a bandgap that is between that of the upper cladding layer 19 and that of the contact layer 48, and in some cases may have a variable bandgap. The contact layer and the transition layer may absorb the light generated in the laser. For example, if an optical cavity 18 having the materials described above generates laser light with a 1310 nm wavelength, the InGaAs contact layer 48 will absorb this light after it is reflected upward from the 45° total internal reflection facet illustrated at 22. Additionally, if the bandgap of the InGaAsP transition layer 21 is smaller than about 0.95 eV, corresponding to a wavelength of 1310 nm, then the transitional layer will also lead to absorption. Removal of any absorbing layers is, therefore, important to the efficient and reliable operation of the laser. This is accomplished, as illustrated in FIG. 1, by providing an aperture 52, in accordance with the first embodiment of the present invention. On the other hand, if the laser wavelength is 980 nm and the contact layer is GaAs, there is no need to remove the GaAs contact layer, since it is transparent at that wavelength, but if the lasing wavelength is 830 nm, then removal of the GaAs contact layer would be desirable. The aperture 52 is formed in contact layer 48 by a patterning and etching process, with the opening being located at the open area 41 of the ridge at emitter end portion 24. This aperture allows light to be emitted from the laser cavity, as described above. It is noted that the beam will normally have a circular or elliptical shape.

The top electrode is deposited on contact layer 48 on the laser and MPD, and a second electrode 54 is deposited on a bottom surface 56 of the substrate, so that a bias voltage can be applied across the ridge 36 between the electrodes to produce lasing. A zero or negative bias can also be applied across the MPD to allow it to generate an electrical current based on the light that impinges upon it. Laser light propagating in the optical cavity 18 will be reflected by facet 22 to exit vertically at first end 24, as indicated by arrow 26, and some light will exit horizontally, in the plane of the active region 20, through the facet 30 at second end 28. Some of the light exiting through facet 30 will be reflected back into the cavity by the DBR reflector 32 and some will pass through reflector 32 to impinge on the front surface 58 of the MPD 34, where it will be detected. Light which passes through the MPD will be dissipated by facet 44, as indicated by arrow 60 (FIG. 3) at the back of the MPD. The monolithically fabricated MPD 34 is not limited to monitoring the operation of the laser, as by measuring its intensity in this configuration, for if desired the MPD can also be used as an extremely fast detector to provide feedback to a circuit that drives the laser.

A laser cavity can be optimized by using reflectivity modification coatings. In conventional cleaved-facet lasers, one facet may have a high reflectivity coating while the other facet may be coated to lower reflectivity, for example 90% and 10% reflectivity, respectively, so that most of the laser light emerges from the lower reflectivity facet. In short cavities both facets may have high reflectivity to reduce the cavity round-trip loss, but typically one facet will have a lower reflectivity than the other, for example 99.9% and 99.0% nominal reflectivity, respectively, to allow most of the laser light to emerge from the lower reflectivity facet. In a second embodiment of the invention, illustrated in FIG. 4, the laser 10 is fabricated in the manner described above, with common elements having the same reference numerals. However, in this case a dielectric layer or stack 70 is deposited on the open area 41 at the first end 24 of the ridge 36 so that it modifies the reflectivity that emitted beam 26 experiences. In addition, as illustrated in FIG. 5, the facet 30 at the reflector end 28 of the optical cavity 18 may incorporate an optical layer or stack 72 instead of the Bragg reflector 32. The use of very high reflectivity coatings at both ends of a very short cavity of below around 5 µm can produce single mode behavior due to the large longitudinal mode spacing of a very short cavity. Modifications in reflectivity can be used to optimize the performance of the laser cavity.

Figure 6:
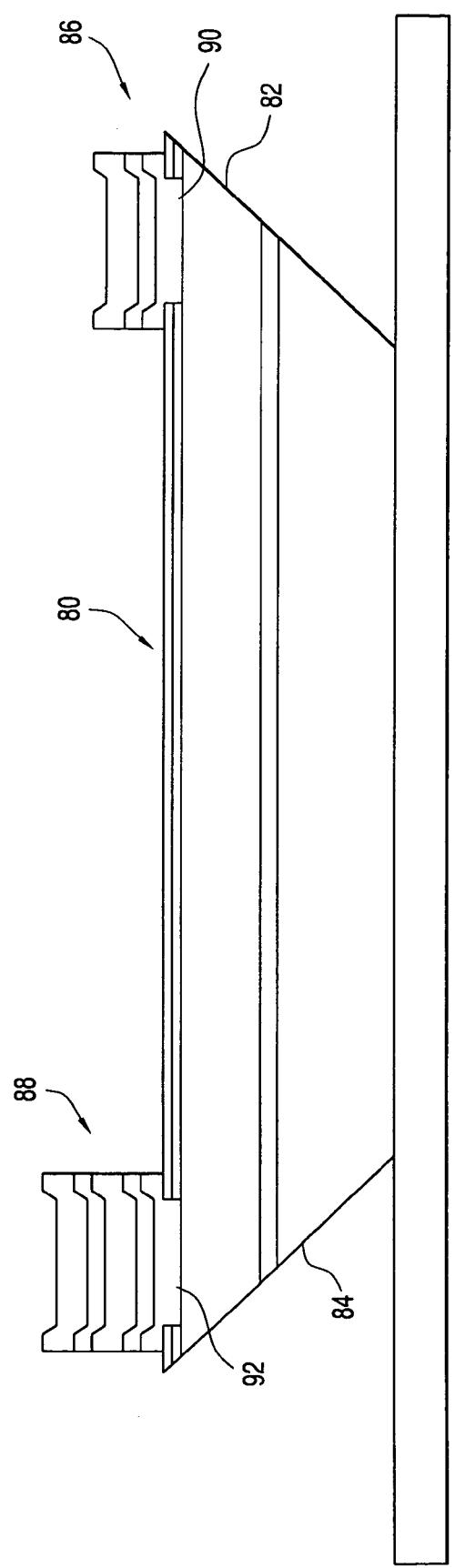
FIG. 6 is a side elevation of a fourth embodiment of a surface-emitting laser in accordance with the invention.

Instead of having the back end facet 30 of the laser cavity 18 be a vertical facet, that facet can also be etched at about a 45-degree angle as illustrated in FIG. 6. In this figure, a laser cavity 80, fabricated as described above, is etched at both ends to provide angled facets 82 and 84. This type of laser provides horizontal surfaces for corresponding reflective coatings 86 and 88 formed over apertures 90 and 92, respectively. The illustrated structures can emit light that is perpendicular to the substrate at both the back facet 84 and the front facet 82, with the apertures being provided to avoid absorption in the contact layer and transition layers.

Single longitudinal mode lasers are more desirable than multi-longitudinal mode lasers in many applications. One such application is in data communications where longer reaches of communications are obtained with a single longitudinal mode lasers compared to a multi-longitudinal laser. FIG. 7 illustrates an embodiment of the invention wherein a single longitudinal mode surface emitting semiconductor laser 100 is fabricated on a top surface 112 of a substrate 114. As described above for laser 10, a succession of layers 116 forms an optical cavity 118 that includes an active region (not shown) fabricated as described above. An angled facet 122 is formed at a first end 120 through masking and etching downwardly and inwardly at or near a 45° angle with respect to surface 112. The facet is substantially totally internally reflective so that the laser emits an essentially vertical or close to vertical output beam 126. At the second end 128 of the optical cavity, a vertical end facet 130, which is perpendicular to the active layer of the laser, multiple filtering elements 132, a distributed Bragg reflector (DBR) element 134, and a monitoring photo detector (MPD) 136 are formed along the optical axis of cavity 118 through masking and etching. An elongated ridge 140 is formed from the cavity 118 by a masking and etching process.

At the emitter end 120 of the laser, the ridge 140 is enlarged, or tapered outwardly, as illustrated by side walls 142 and 144, to form an open area 145 to allow the beam 126 to be emitted through the surface of the first end without distortion, as described above with respect to FIG. 1. At the second end 128, the back of the MPD portion 136 is etched to form an exit facet 146 which designed to form an angle at or near the Brewster angle for the laser material, so as to have zero or near-zero reflectivity. After passing through filtering elements 132 and DBR element 134, some of the laser light generated in optical cavity 118 is received by MPD 136, which then provides a measure of the operation of the laser. Any light that reaches facet 146 is dissipated because of its zero or near-zero reflectivity to prevent undesirable back reflection to the laser.

After the etching steps described above, a top electrical contact layer (not shown) such as that described with respect to FIG. 1 is formed on the top surface of the ridge and on the MPD, and this layer is patterned so as to provide an opening 148 in the contact layer in the open area 145. This opening is located over the facet 122 at end portion 120 to permit light generated in the laser cavity to be emitted in a circular or elliptical shape, as beam 126.

A second electrical contact layer (not shown) is deposited on the bottom surface of the substrate, so that a bias voltage can be applied across the ridge to produce lasing and a zero or negative bias can be applied across the MPD to allow it to generate an electrical current based on the light that impinges upon it. The laser light so produced in the optical cavity will exit vertically at first end 120, as indicated by arrow 126, and longitudinally at second end 128, where some light will be transmitted through the facet 130, through filters 132, and through the DBR element 134, and will impinge on the front end 150 of the MPD 136 to be detected by the MPD and then dissipated at the back facet 146 of the MPD.

Figure 4:
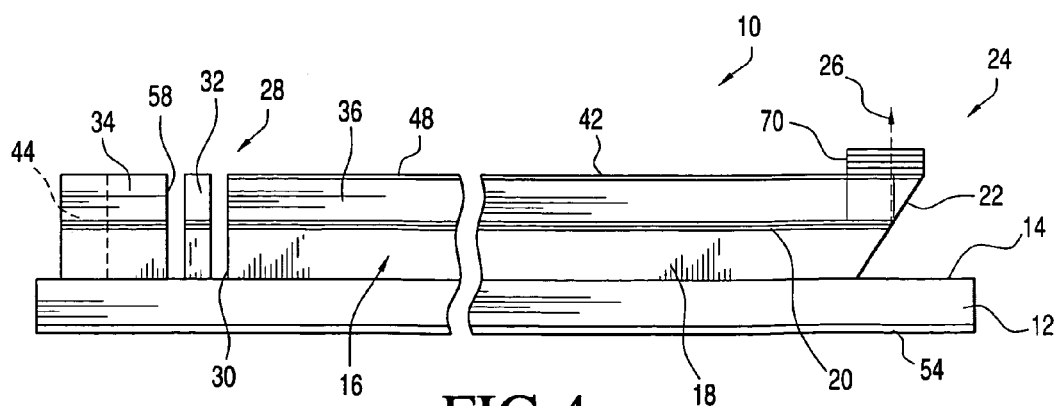
FIG. 4 is a side elevation of a second embodiment of a surface-emitting laser in accordance with the invention.
Figure 5:
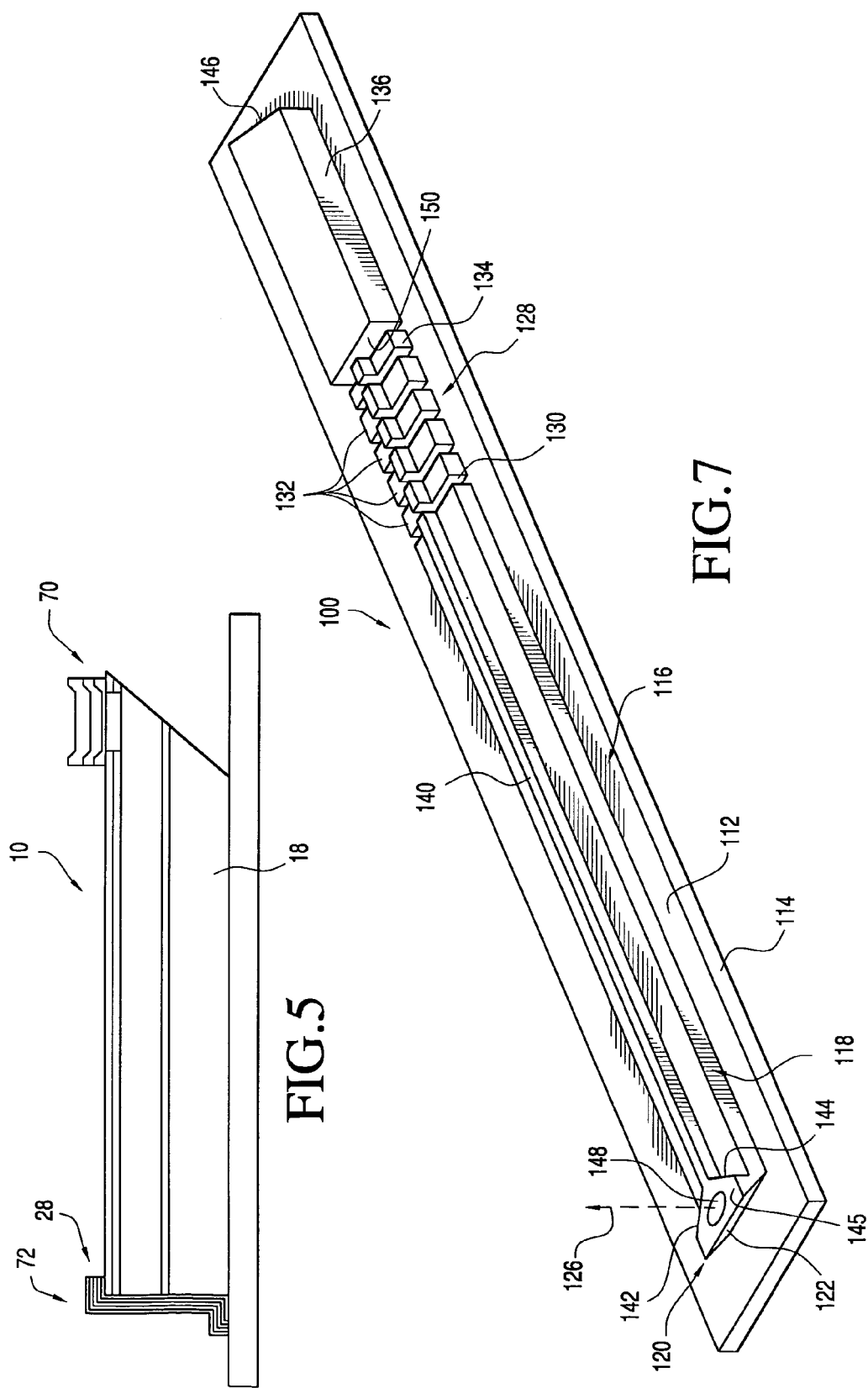
FIG. 5 is a side elevation of a third embodiment of a surface-emitting laser in accordance with the invention.

As is the case with the device of FIGS. 1-3, the single longitudinal mode device 100 of FIG. 7 can have a dielectric layer or stack (not shown) deposited at the first emitter end 120 of the ridge, in the manner illustrated in FIG. 4, so that it modifies the reflectivity of the emitter end.

Although single DBR elements 32 and 134 are illustrated in the embodiments of FIGS. 1 and 7, respectively, it will be understood that multiple DBR elements could also be used to obtain higher reflectivity at the second ends 28 and 128, respectively. The DBR elements can take the form of element 32 in FIG. 1 where the DBR is not patterned during the ridge etch so that it does not acquire the ridge configuration, or can take the form of element 134 in FIG. 5 where the element includes the ridge shape. Furthermore, it will be understood that the DRB element(s) can be replaced by a dielectric reflectivity modification layer or stack.

Figure 8:
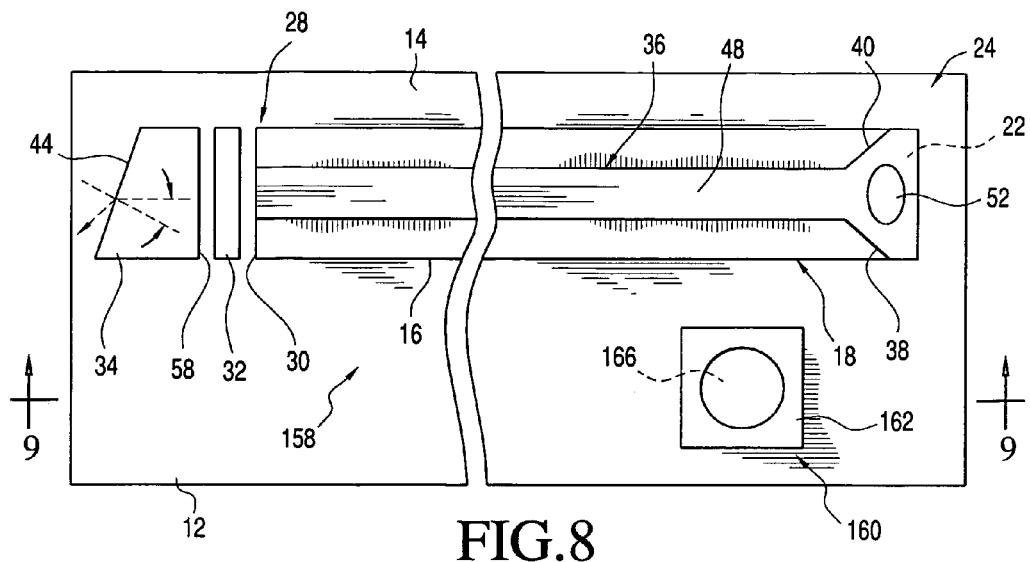
FIG. 8 is a top plan view of a sixth embodiment of the invention, combining a surface emitting laser and an area detector.
Figure 9:
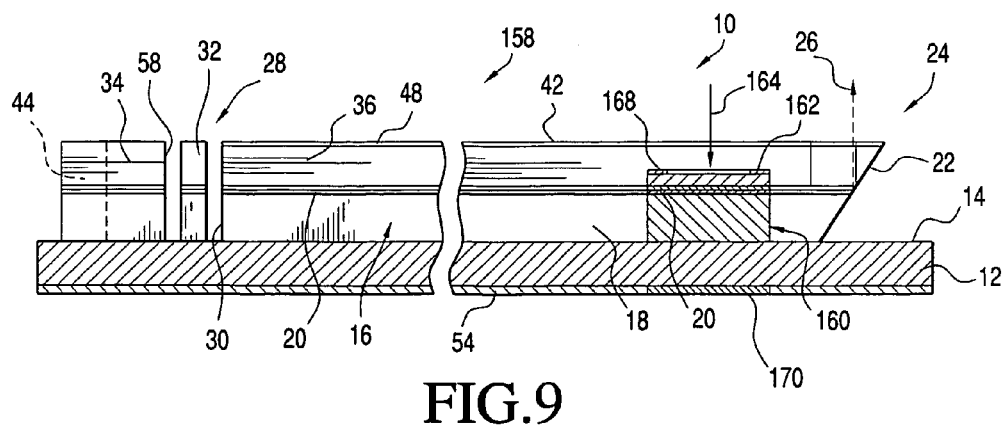
FIG. 9 is a side elevation in partial section of the laser and area detector of FIG. 8.

In modern systems, it is highly desirable to have a transmitter of light and a detector of light side-by-side on a single substrate, or chip. Having such a combination is even more desirable if the devices are made out of the same material. Accordingly, in the embodiment of the invention illustrated in FIGS. 8 and 9, a surface emitting, or vertically emitting, laser 158, which may be a laser such as the laser 10 of FIG. 1, is combined with a detector 160 to provide both a light emitter and a light detector on a common substrate, such as the substrate 12 of FIG. 1. The surface-emitting laser 158 is similar to that of FIG. 1 for purposes of illustration, and common features are similarly numbered, but it will be apparent that variations of the surface emitter can be used. FIG. 9 is a cross-sectional view taken along line 9-9 of FIG. 8 to illustrate the structure of detector 160. For the sake of clarity, in FIG. 9 the detector is shown to have a height smaller than the laser, but this is not a requirement.

Area detector 160 is located adjacent to surface emitting laser 158, as illustrated, and is fabricated from the same layers 16 as were deposited on the substrate to form the optical cavity. The detector is masked and etched in these layers during the masking and etching steps used for forming the second end 28 of the laser, which steps include formation of the vertical end facet 30 (which is perpendicular to the active layer of the laser), the distributed Bragg reflector (DBR) element 32, and the monitoring photo detector (MPD) 34.

The area detector 160, in the illustrated configuration, may be generally rectangular with a top surface 162 that receives an impinging beam 164 within a detection area 166, and uses the same active layer 20 as the one used in the laser 10. A top electrical contact 168 is applied on the top surface 162 of the detector, while leaving the area of detection 166 free of this contact. A bottom contact 170 is also applied to the back of the substrate 12 and a negative or zero bias is applied between the top and the bottom contacts 168 and 170 to allow an incoming beam 164 to be detected by the detector.

Figure 10:
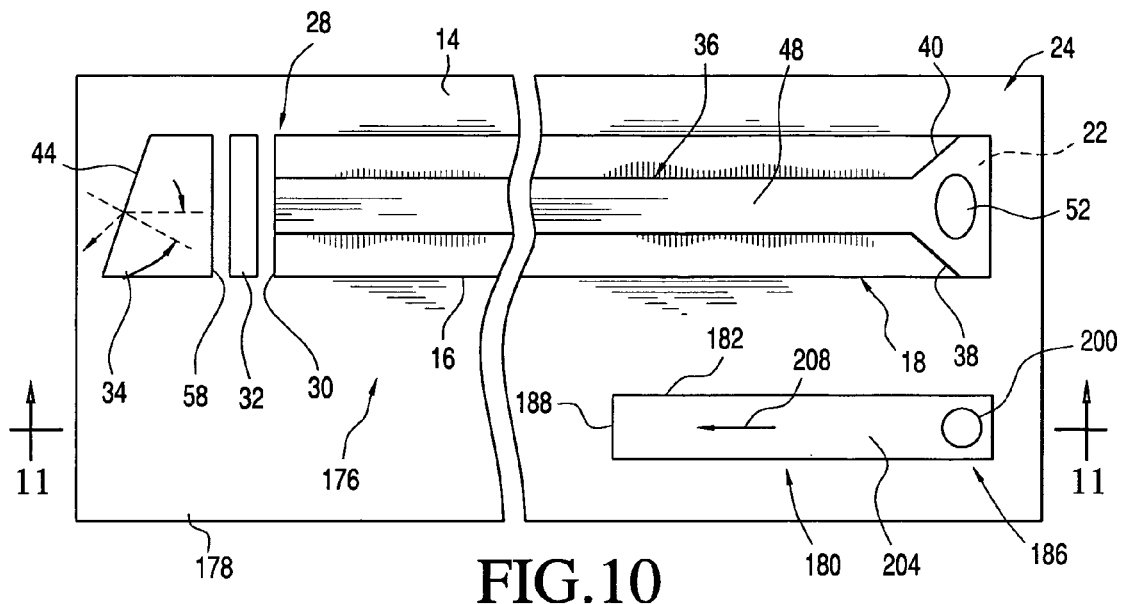
FIG. 10 is a top plan view of a seventh embodiment of the invention, combining a surface emitting laser and an in-plane detector.
Figure 11:
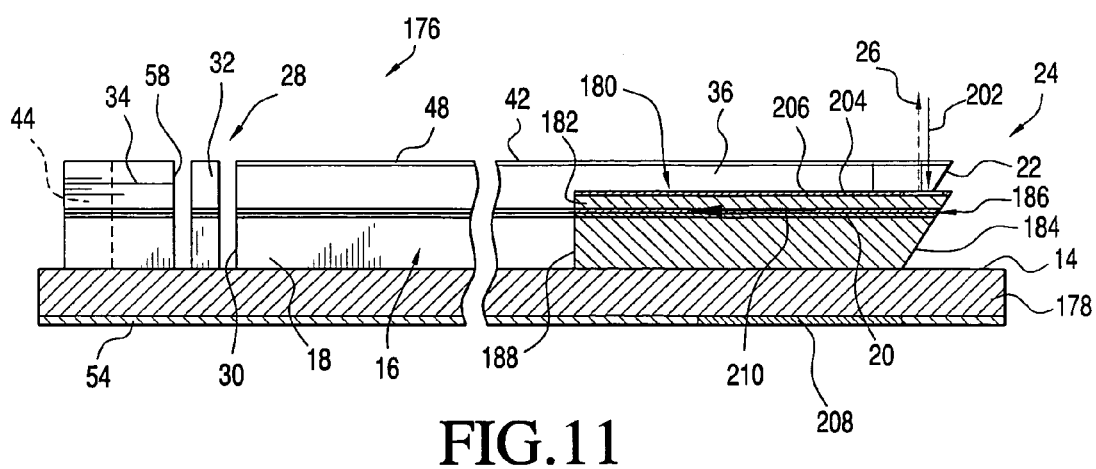
FIG. 11 is a side elevation in partial section of the laser and in-plane detector of FIG. 10.

In another embodiment of the invention, illustrated in FIGS. 10 and 11, a surface-emitting laser 176, which may be similar to laser 10 of FIG. 1 for purposes of illustration, is combined with an in-plane detector 180 on a substrate 178. Features in common with the surface-emitting laser 10 of FIGS. 1-3 are similarly numbered, with FIG. 11 being a cross-section taken along lines 11-11 of FIG. 10. For clarity, the detector 180 is shown to have a height smaller than the laser 176 in FIG. 11.

The in-plane detector 180 is located adjacent and generally parallel to the surface-emitting laser 176. Detector 180 incorporates an elongated body portion 182 having a longitudinal axis that is illustrated as being parallel to the axis of the optical cavity 18 of laser 10; however, it will be understood that these axes need not be parallel. The detector body is fabricated in the deposited layers 16 from which the laser optical cavity is formed, using the same masking and etching steps. A reflective input facet 184 is formed at a first, input end 186 of the detector, with facet 184 being etched at or near a 45° angle with respect to the surface of substrate 178 during the formation of facet 22 on laser 10. The body portion 182 and a back facet 188 are formed during the masking and etching steps used to form the second, or reflector, end 28, the vertical end facet 30, the distributed Bragg reflector (DBR) element 32, and the monitoring photo detector (MPD) 34 of laser 176. Although the detector back facet 188 is shown as being perpendicular to the plane of the active layer 20 of the deposited material, it will be understood that this facet can be etched at an angle other than perpendicular.

The in-plane detector 180 includes a top surface region 200 for receiving an impinging light beam 202 to be detected (FIG. 11), at the same active layer 20 as the one used in the laser. A top electrically conductive contact 204 is applied on the top surface 206 of the detector 180, with an aperture being formed in the contact in the area of detection 200, so that the impinging light is not blocked. A bottom electrically conductive contact 208 is applied to the back of the substrate 12 in the region of the detector, and a negative or zero bias is applied between the top and the bottom contacts. An incoming beam 202 enters the detector through its top surface in the region 200, and is reflected by internally reflective facet 184 to be directed longitudinally along the axis of the detector active layer 20, as illustrated by arrow 210, for detection in known manner.

The reflectivity of areas 166 (FIG. 8) and 200 (FIG. 10) can be modified by depositing dielectric layers or stacks on these areas to provide antireflection surfaces for incoming beams 164 and 202, respectively. This would allow more efficient collection of the light by the detector.

It will be understood that multiple lasers and/or detectors such as those described above can be fabricated on a single substrate in the form of an array, to thereby enable applications such as parallel optical interconnects, wavelength selectivity, and the like. For example, multiple lasers of different wavelengths such as the array 218 illustrated in FIGS. 12 and 13 can be provided on the same chip or substrate, and can be positioned to direct their outputs into a single output medium such as, for example, a fiber. Thus, the array 218 of lasers may be configured to extend radially from a common center or hub 219 with four lasers 220, 222, 224 and 226 of the kind illustrated at 100 in FIG. 7 being positioned on a common substrate 228 in such a way that their respective output ends, 230, 232, 234 and 236 are clustered in close proximity to one another and around a central axis 240, with the second ends of the lasers extending radially outwardly from the hub. The output beams from the lasers are emitted vertically upwardly, in a direction perpendicular or close to perpendicular to the surface of substrate 228 and parallel to axis 240. By providing each of the four lasers with a different bandgap, each laser produces an output beam having a different wavelength, so that the array 218 produces an output along axis 240 of a selected wavelength or combination of wavelengths that may then be directed to a common output device such as an optical fiber 242. Although four lasers are illustrated, it will be understood that this is for purposes of illustration, and that other numbers of lasers may be used. The band gaps of each laser may be selected through a process such as impurity-free vacancy diffusion or regrowth, with such techniques being well known in the field.

The output ends 230, 232, 234 and 236 of the four lasers each include an angled facet, and these are formed in the same masking step, but with four separate etching steps. A slight deviation from a 45° angle etch in each of the etching steps can be used to guide the four beams slightly away from the perpendicular so that they impinge on the centrally located object, such as the fiber 242. The back facets, filtering elements, and the MPDs for the four lasers are formed through a common masking and etching step. Finally, the ridge structure is formed through masking and etching, and the devices are metallized on the top and the bottom surfaces to provide electrical contacts, as described above.

Figure 12:
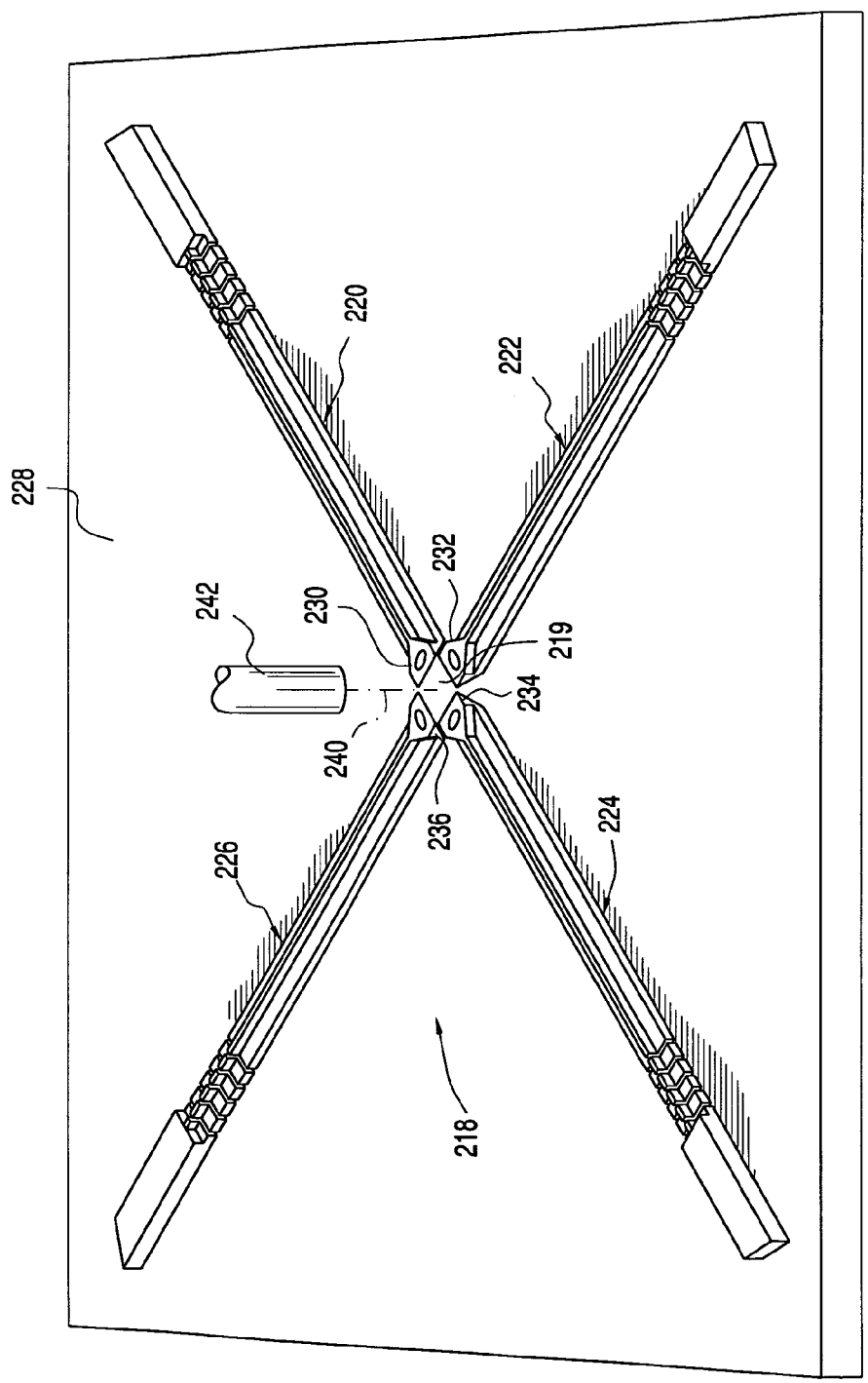
FIG. 12 is a top perspective view of an eighth embodiment of the invention, incorporating multiple surface emitting lasers in accordance with the invention.
Figure 13:
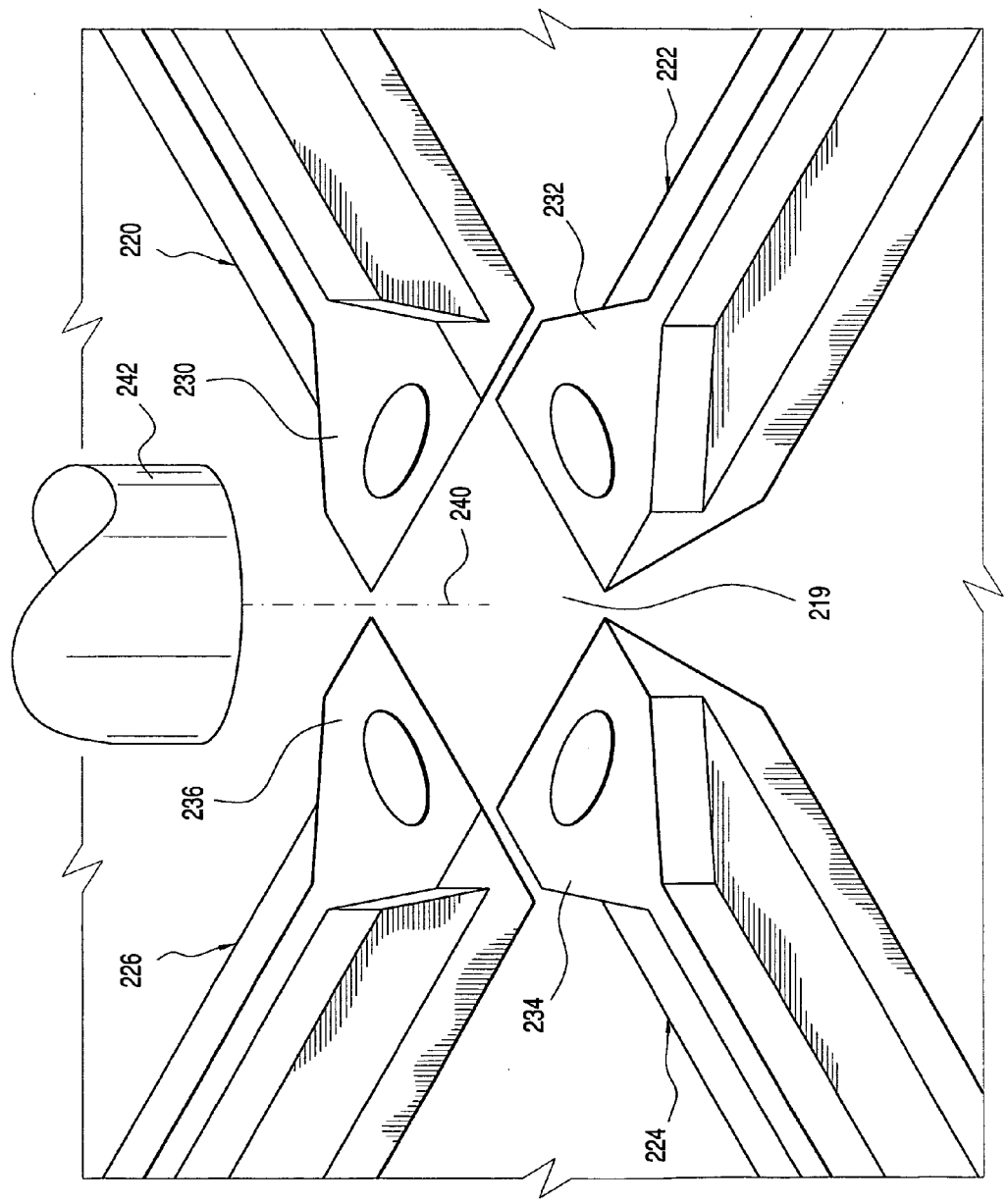
FIG. 13 is an enlarged view of the surface emitting regions of the multiple lasers of FIG. 12.
Figure 14:
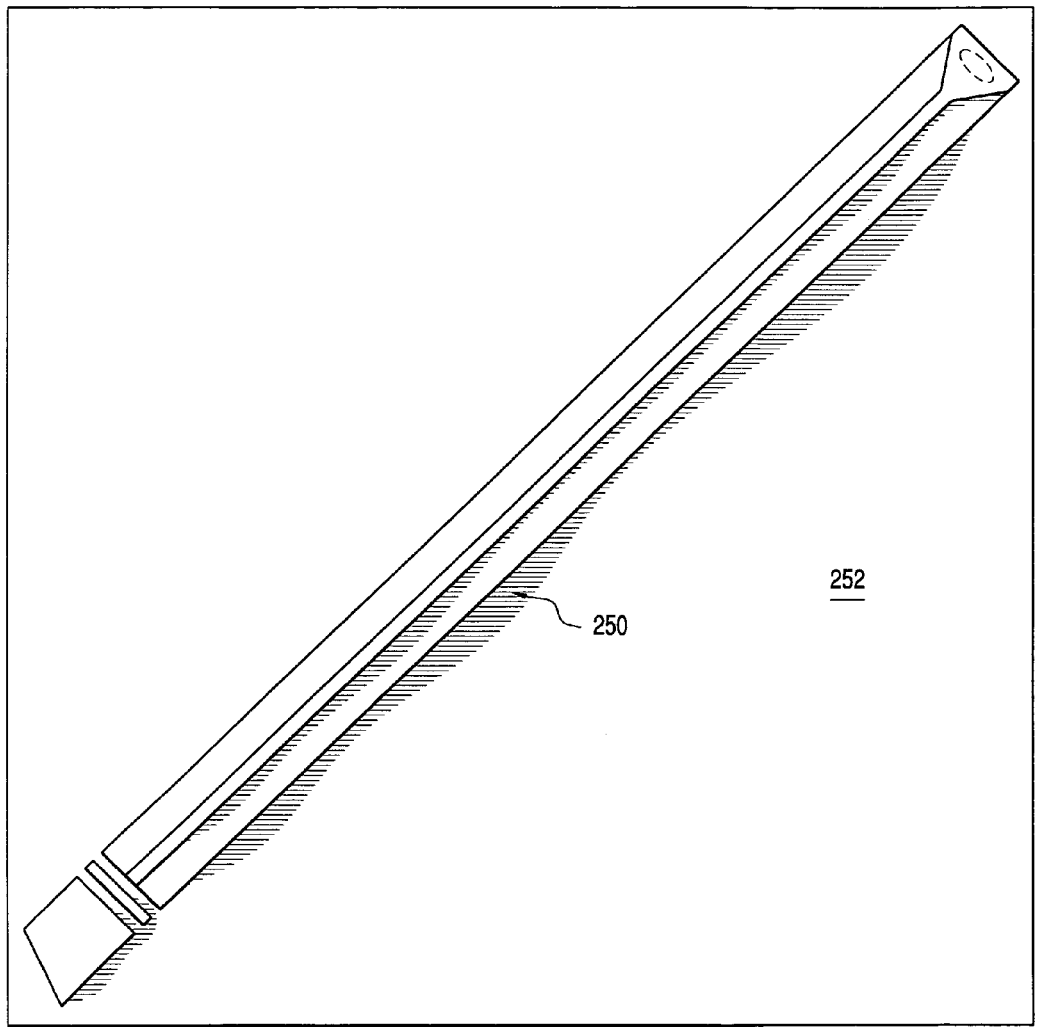
FIG. 14 is a top plan view of a laser positioned for improved packing density.

The radial array 218 of the lasers is possible because the CAIBE process that is used in fabricating the lasers provides a uniform etch that does not depend on the crystallographic planes of the semiconductor crystal. This allows surface-emitting lasers to be positioned in any desired configuration on the substrate, as illustrated in FIG. 12 and as further illustrated in FIG. 14, wherein a semiconductor laser 250 is positioned diagonally on a rectangular substrate 252. Conventional methods, using cleaving to form facets for example, do not permit such positioning.

As discussed above, light 260 ($l_1$) propagating in laser cavity 18 is totally internally reflected by the angled facet 22 and is reflected upwards, as illustrated schematically by beams 262 and 264 in FIG. 15(*a*). The reflected light experiences diffraction as it travels up through the upper cladding layer of the laser cavity, with the reflected beams 262 diverging in the manner illustrated. The light is partially emitted and partially reflected back from the top surface of the cavity in the region of aperture 52 (see FIG. 1), the reflected light, illustrated by beam 266 and 268, experiencing further divergence as it travels down through the upper cladding layer. The returned light reflects once again from the totally internally reflective facet 22, but due to the divergence it has experienced, only a portion of the light is coupled back into the waveguide as a guided mode 270($l_2$), with the remainder being lost to unguided modes, illustrated at 272.

Figure 16:
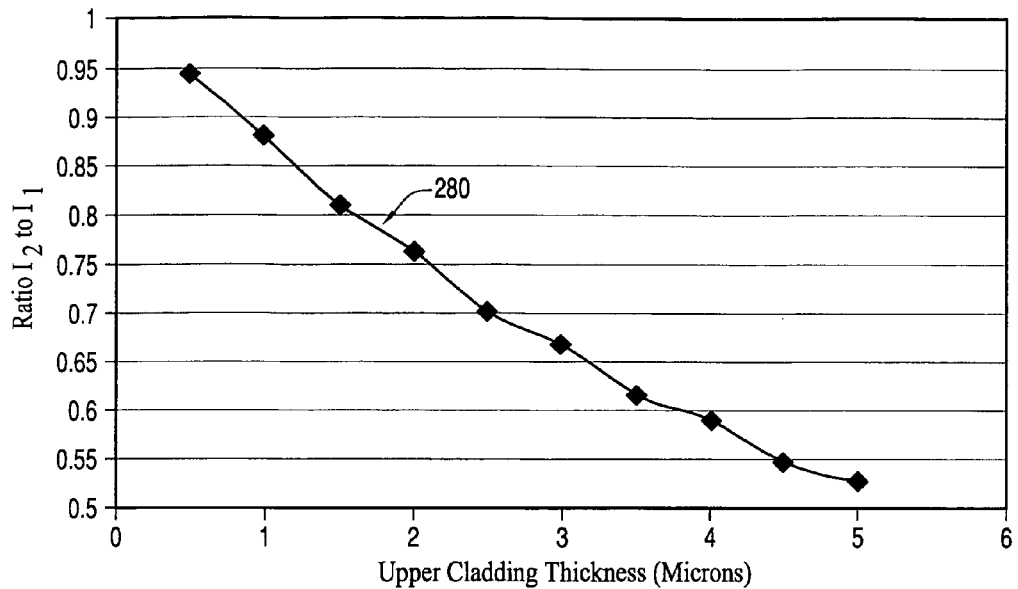
FIG. 16 is a graphical illustration of the effect of the mode mismatch of FIG. 15(a) and 15(b)

FIG. 15(*b*) shows 2-dimensional finite-difference time-domain (FDTD) simulation 274 of the same region of the surface-emitting laser structure as illustrated in FIG. 15(a), provided by a commercially available program such as, for example, the program available at http://www.rsoftdesign-group.com/products/component design/FullWAVE/). The illustrated divergence can have a detrimental effect in coupling to the waveguide cavity 18, as shown in the graph 280 of FIG. 16. The vertical axis of the graph is the ratio of $l_2$ to $l_1$ normalized to 1, where $l_1$ is waveguided light 260 impinging on the angled facet 22 and $l_2$ is the beam 270 that is coupled back into the laser waveguide. The graph 280 shows that the ratio is reduced as the upper cladding thickness is increased. In many situations, the upper cladding thickness needs to be of a certain minimum thickness to allow efficient operation of the laser. However, poor coupling back into the waveguide can result in inefficient operation of the laser.

Figure 17:
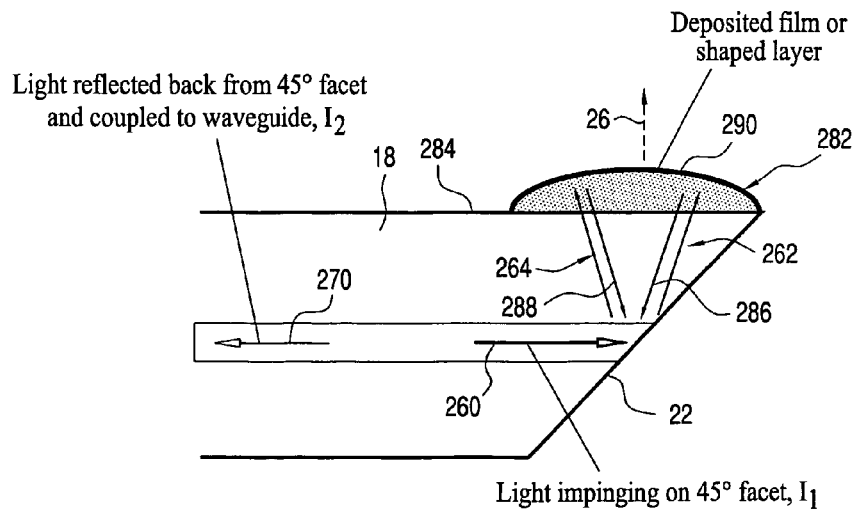
FIG. 17 is a cross-sectional view of a surface emitting or receiving photonic device incorporating a top surface lens.

The effect of the beam divergence described above can be compensated, in accordance with the invention, through the provision of a lens 282 on the top surface 284 of the laser optical cavity 18. As illustrated in FIG. 17, the lens is placed on the surface 284 above the angled facet 22, for example in the location of aperture 52 in the device of FIG. 1, and is shaped to reflect the diverging beams 262 and 264 back along the same paths to the facet 22, as illustrated by return beams 286 and 288. These returned beams are then reflected from facet 22 and are coupled axially into the cavity 18 as coupled beam 270, providing improved laser efficiency.

The lens 282 may be fabricated by the deposition of a film, such as e-beam evaporated silicon, on the top surface 284 above the angled facet; for example in aperture 52, as shown in FIG. 17 to compensate for the divergence. A semi-cylindrically shaped silicon lens having a surface 290 of a given radius can be fabricated through the use of a conventional lift-off pattern, e-beam evaporation of silicon, and a rocking motion of the sample along the axis of the laser cavity during the evaporation. If a semi-spherical lens (or a lens having a shape between semi-cylindrical and semi-spherical) is required, the rocking motion is also performed along an axis perpendicular to the axis of the laser cavity. Alternatively, the divergence-compensating lens 282 can be formed by etching a suitable layer of the semiconductor laser structure, such as the InP cladding layer. This can be performed, for example, through conventional lithographic patterning and CAIBE.

As an illustrative example, a laser structure such as laser 18 in FIG. 17 may be based on an InP substrate, with lower and upper cladding layers of InP and an active layer of about 0.25 μm of quantum well barriers of InAlGaAs, but with the transition layer of InGaAsP and the contact layer of InGaAs removed above the angled facet to form an aperture, as discussed above with respect to FIG. 1. The upper cladding was 1.375 μm for the laser structure of this example. The medium outside the laser was selected to be air. The modal reflectivity within cavity 18 is defined as the ratio of the axially propagating light 260 impinging on the facet 22 to the light 270 reflected back along the axis; i.e., the ratio of $l_2$ to $l_1$, but this value also includes the reflectivity at the surface 284 (with or without the lens) and this definition will be used in the following discussion.

Figure 18:
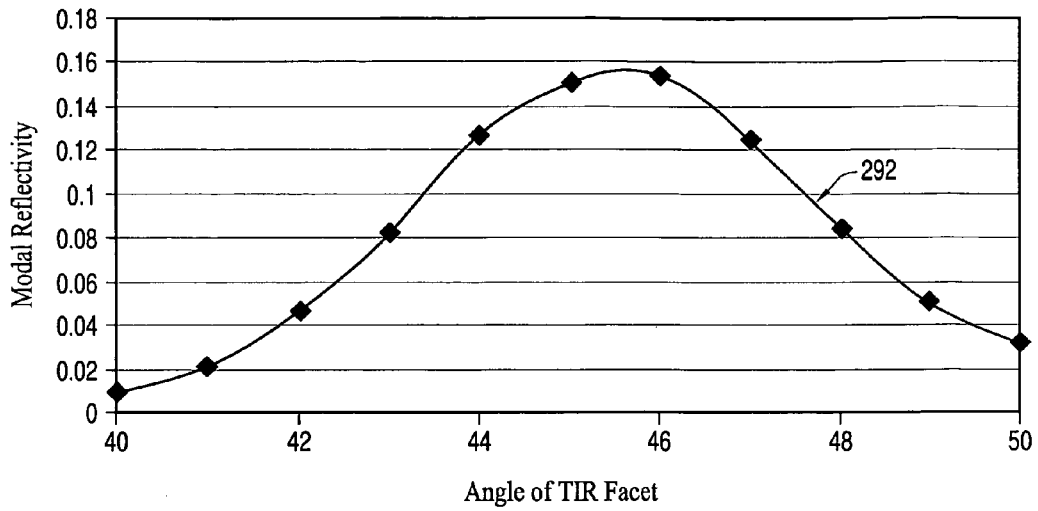
FIG. 18 is a graphical illustration of the effect of varying the angle of a total internal reflecting facet in the device of FIGS. 15(a) and 15(b)

The angle of the total internal reflecting facet 22 with respect to the longitudinal axis of the laser has an impact on the modal reflectivity. The graph 292 in FIG. 18 shows the impact on modal reflectivity of varying the angle of the total internal reflecting facet 22 above and below 45°. This graph is obtained through 2-d FDTD simulations using the illustrative laser structure. An angle below 45° means that the facet is etched closer to the perpendicular to the substrate. This graph shows that the peak modal reflectivity is obtained at about 45.5°. Simulations have also shown that beam-pointing of the emerging laser light, indicated by arrow 26, can be compensated for by changing the angle of the facet.

Figure 19:
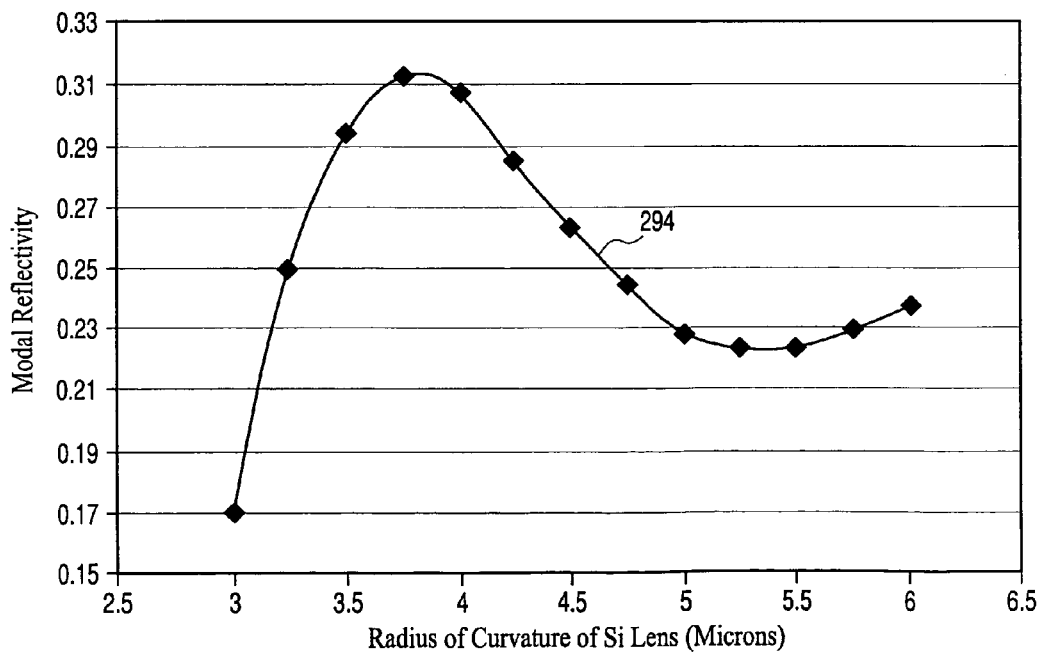
FIG. 19 is a graphical illustration of modal reflectivity for various radii of a silicon lens for the device of FIG. 17.
Figure 20:
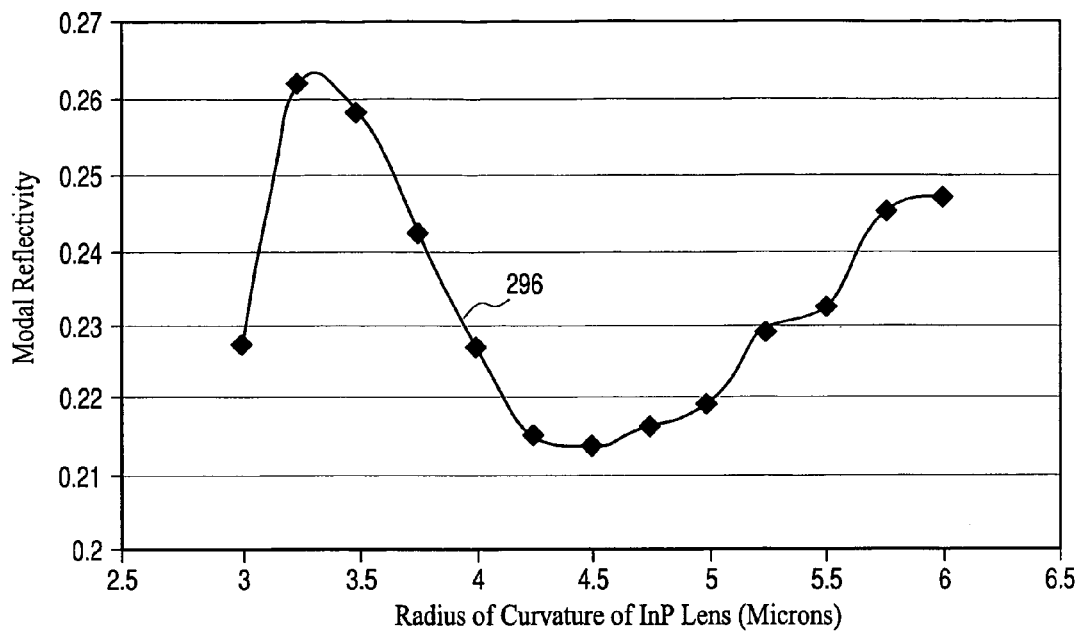
FIG. 20 is a graphical illustration of modal reflectivity for various radii of an InP lens for the device of FIG. 17.

The optimization of the dispersion-compensating lens is determined using the same illustrative laser structure, with the angle of the total internal reflection facet 22 set at 45.5°. The graph 294 in FIG. 19 shows the modal reflectivity obtained with various radii for the semi-cylindrical silicon lens 282, using 2-d FDTD simulations. This graph shows that optimal modal reflectivity is at a radius of curvature of 3.75 μm for a Si lens. Similarly, the graph 296 of FIG. 20 shows that optimal modal reflectivity is at a radius of curvature of 3.25 μm for an InP lens.

Although the divergence-compensating lens 282 and the angle modification have been described in terms of a surface emitting laser, it is understood that the same solutions may be applied to other surface emitting and receiving devices. Further, although particular examples of materials and laser structures were used to illustrate the embodiments of the present invention, it will be understood that other materials and lasers structures (e.g., other laser structures based on InP, GaAs, and GaN) may be used.

Figure 21:
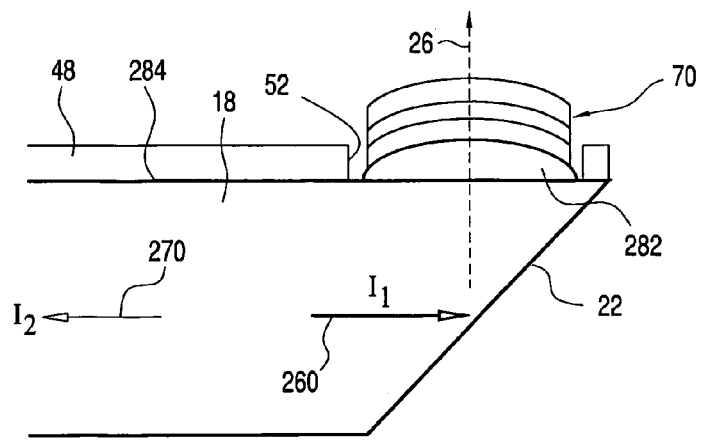
FIG. 21 is a cross-sectional view of the device of FIG. 17, incorporating a dielectric layer.

It will also be understood that the reflectivity modification layers, or stacks, such as the stack 70 illustrated in FIG. 4, may be positioned on top of the divergence compensating lens 282 in the manner illustrated in FIG. 21, and that the lens may be used in combination with the various embodiments illustrated in FIGS. 1-14. Thus, as illustrated, the lens 282 may be fabricated within aperture 52, with the stack 70 then being fabricated or otherwise located over the lens. In this way, the perpendicular beam 26 is emitted from the device through the lens 282 and the stack 70, while light that is reflected by the emitting surface and by the lens is coupled to the light propagating axially in the optical cavity 18.

Although the present invention has been illustrated in terms of preferred embodiments, it will be understood that variations and modifications may be made without departing from the true spirit and scope thereof as set out in the following claims.

What is claimed is:

1. A surface emitting photonic device comprising:
    a semiconductor substrate;
    an epitaxially deposited optically transmissive semiconductor medium positioned on said substrate, said medium incorporating an active region for generating laser light;
    at least a first etched facet positioned on said medium perpendicular to said substrate;
    at least a second facet positioned on said medium at an angle to said substrate; and
    a lens positioned on a surface of said medium above said second facet.

2. The device of claim 1, wherein said second facet is at an angle of at or about 45° with respect to said substrate.

3. The device of claim 1, wherein said second facet is internally reflective and angled to cause light generated in said active region to be emitted in a direction that is substantially perpendicular to said substrate.

4. The device of claim 3, further including a filter on said medium for filtering said emitted light.

5. The device of claim 3, wherein said first facet is partially reflective, and further including a monitoring photo detector adjacent said first facet and axially aligned with said medium.

6. The device of claim 5, further including a distributed Bragg reflector element interposed between said first facet and said photo detector.

7. The device of claim 5, further including multiple filters interposed between said first facet and said photo detector.

8. The device of claim 1, further including a surface area detector on said substrate and fabricated in said medium.

9. The device of claim 1, further including an in-plane detector on said substrate and fabricated in said medium.

10. The device of claim 9, wherein said detector includes an inlet end incorporating an angled facet for deflecting impinging light into the detector.

11. The device of claim 10 further including a lens on a surface of said inlet and above said angled facet for deflecting impinging light into the detector.

12. The device of claim 1, wherein said optically transmissive medium comprises multiple layers on a top surface of said substrate to provide an active region substantially parallel to said top surface.

13. The device of claim 12, further including electrodes on said medium and on said substrate for receiving a bias voltage to activate the active region of said medium to produce a laser output beam.

14. The device of claim 13, wherein said medium is a ridge laser.

15. The device of claim 12, wherein said medium is shaped to form an elongated laser cavity having said first facet at a first end of the cavity and having said second facet at a second end of the cavity.

16. The device of claim 12, wherein said medium is shaped to form multiple elongated laser cavities, each cavity having a first facet positioned at a first end and having a second facet at a second end, the second ends being clustered to emit light along a common axis.

17. A surface receiving detector comprising:
a semiconductor substrate;
an epitaxially deposited optically transmissive semiconductor medium positioned on a top surface of said substrate;
at least a first etched facet positioned on said medium perpendicular to said substrate;
at least a second facet positioned on said medium at an angle to said substrate; and
a lens positioned on a top surface of said medium above said second facet.

18. A semiconductor photonic device comprising:
a semiconductor substrate;
a semiconductor structure epitaxially deposited on said substrate;
an optically transmissive medium included in said structure, said medium incorporating an active region for generating laser light;
at least one facet for said medium at an angle to said substrate;
a contact layer on said structure for providing an ohmic contact to said structure, said contact layer being partially removed from said structure to provide an aperture in the region of said facet; and
a lens positioned on said aperture.

19. The device of claim 18, wherein said at least one facet directs light from said medium at an angle to said substrate and through said aperture and said lens.

20. The device of claim 19, further including a second facet for said medium at an angle to said substrate, said contact layer being removed from said structure to provide a second aperture in the region of said second facet.

21. The device of claim 20, further including a lens on said second aperture.

22. A surface emitting photonic device, comprising:
a semiconductor substrate;
an epitaxially deposited optically transmissive semiconductor medium on said substrate, said medium incorporating an active region for generating laser light;
a first etched facet positioned on a first end of said medium;
a second fully internally reflective facet at a second end of said medium and positioned at an angle with respect to said substrate to direct generated laser light toward a top surface of said medium;
a lens positioned on said top surface to receive said generated laser light and to transmit a portion of said light out of said medium and to reflect the remainder of said light back into said medium.

23. The device of claim 22, wherein said second facet is at an angle with respect to said substrate that is selected to maximize modal reflectivity in said medium.

24. The device of claim 23, wherein said second facet is at an angle of about 45°.

25. The device of claim 22, wherein said lens has a curved surface having a radius selected to maximize modal reflectivity in said medium.

26. The device of claim 25, wherein said second facet is at an angle with respect to said substrate that is selected to maximize said modal reflectivity.

* * * * *